(12) United States Patent
Liu et al.

(10) Patent No.: US 9,879,988 B2
(45) Date of Patent: Jan. 30, 2018

(54) METROLOGY METHOD AND APPARATUS, COMPUTER PROGRAM AND LITHOGRAPHIC SYSTEM

(71) Applicant: ASML Netherlands B.V., Veldhoven (NL)

(72) Inventors: Xing Lan Liu, Veldhoven (NL); Hendrik Jan Hidde Smilde, Veldhoven (NL); Yue-Lin Peng, Taoyuan (TW); Hakki Ergün Cekli, Eindhoven (NL); Josselin Pello, Eindhoven (NL); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/013,340

(22) Filed: Feb. 2, 2016

(65) Prior Publication Data

US 2016/0223322 A1 Aug. 4, 2016

(30) Foreign Application Priority Data

Feb. 4, 2015 (EP) .................................... 15153851

(51) Int. Cl.
*G01B 11/00* (2006.01)
*G03B 27/32* (2006.01)
(Continued)

(52) U.S. Cl.
CPC ........ *G01B 11/272* (2013.01); *G03F 7/70616* (2013.01); *G03F 7/70625* (2013.01); *G03F 7/70633* (2013.01); *G03F 9/7007* (2013.01)

(58) Field of Classification Search
CPC ............... G01B 11/272; G03F 7/70483; G03F 7/70616; G03F 7/70625; G03F 7/70633; G03F 7/70683; G03F 9/7007
(Continued)

(56) References Cited

U.S. PATENT DOCUMENTS

2010/0321654 A1 12/2010 Den Boef
2011/0027704 A1 2/2011 Cramer et al.
(Continued)

FOREIGN PATENT DOCUMENTS

WO WO 2009/078708 A1 6/2009
WO WO 2009/106279 A1 9/2009
(Continued)

OTHER PUBLICATIONS

Amit, E. et al., "Overlay accuracy calibration". Proc. SPIE 8681, Metrology, Inspection, and Process Control for Microlithography XXVII, Apr. 18, 2013; 6 pages.
(Continued)

*Primary Examiner* — Colin Kreutzer
(74) *Attorney, Agent, or Firm* — Sterne, Kessler, Goldstein & Fox P.L.L.C.

(57) ABSTRACT

Disclosed is a method of measuring a parameter of a lithographic process, and associated computer program and apparatuses. The method comprises providing a plurality of target structures on a substrate, each target structure comprising a first structure and a second structure on different layers of the substrate. Each target structure is measured with measurement radiation to obtain a measurement of target asymmetry in the target structure, the target asymmetry comprising an overlay contribution due to misalignment of the first and second structures, and a structural contribution due to structural asymmetry in at least the first structure. A structural asymmetry characteristic relating to the struc- (Continued)

tural asymmetry in at least the first structure of each target structure is obtained, the structural asymmetry characteristic being independent of at least one selected characteristic of the measurement radiation. The measurement of target asymmetry and the structural asymmetry characteristic is then used to determine the overlay contribution of the target asymmetry of each target structure.

20 Claims, 6 Drawing Sheets

(51) Int. Cl.
    *G03B 27/54*     (2006.01)
    *G03B 27/74*     (2006.01)
    *G01B 11/27*     (2006.01)
    *G03F 7/20*     (2006.01)
    *G03F 9/00*     (2006.01)

(58) Field of Classification Search
    USPC .......... 355/67, 68, 77; 356/399–401; 430/22
    See application file for complete search history.

(56) References Cited

U.S. PATENT DOCUMENTS

| 2011/0043791 | A1 | 2/2011 | Smilde et al. |
| 2012/0013881 | A1 | 1/2012 | Den Boef et al. |
| 2012/0242970 | A1 | 9/2012 | Smilde et al. |
| 2013/0308142 | A1 | 11/2013 | Straaijer |
| 2015/0145151 | A1 | 5/2015 | Van Der Schaar et al. |

FOREIGN PATENT DOCUMENTS

| WO | WO 2011/012624 A1 | 2/2011 |
| WO | WO 2011/080016 A2 | 7/2011 |
| WO | WO 2013/143814 A1 | 10/2013 |
| WO | WO 2015/018625 A1 | 2/2015 |
| WO | WO 2015/078669 A1 | 6/2015 |

OTHER PUBLICATIONS

International Search Report and Written Opinion of the International Searching Authority directed to International Application No. PCT/EP2016/051007, dated Jun. 21, 2016; 10 pages.

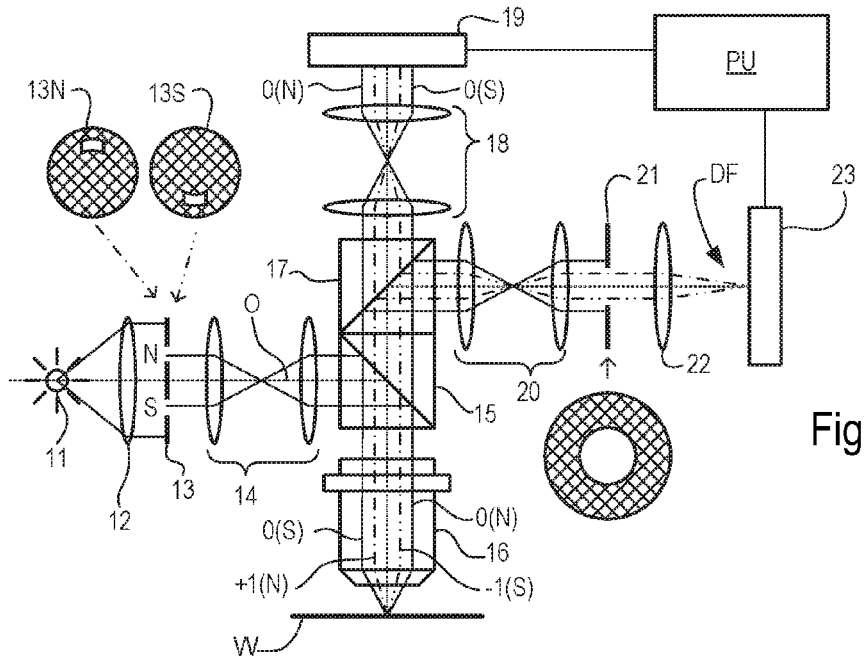
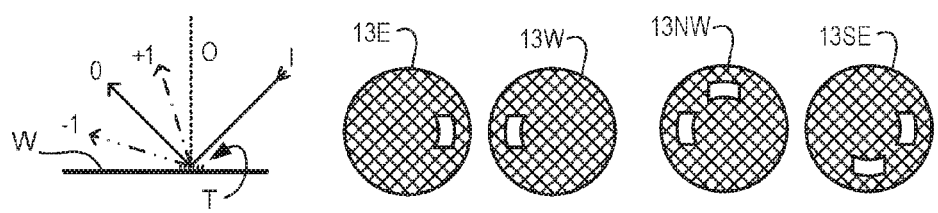
Fig. 3(a)
Fig. 3(b)   Fig. 3(c)   Fig. 3(d)
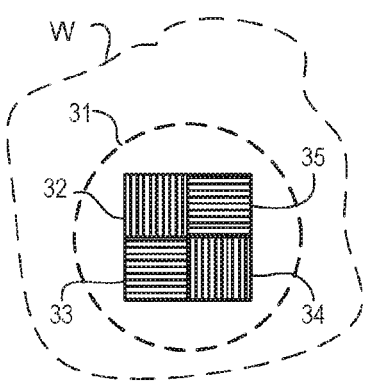
Fig. 4
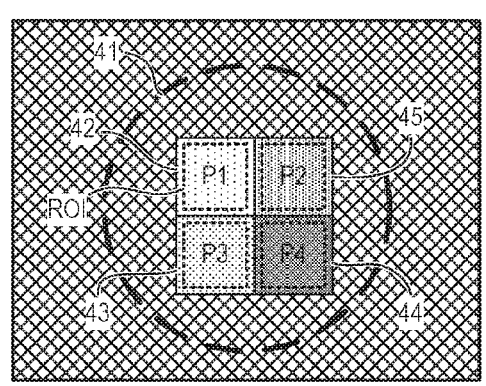
Fig. 5

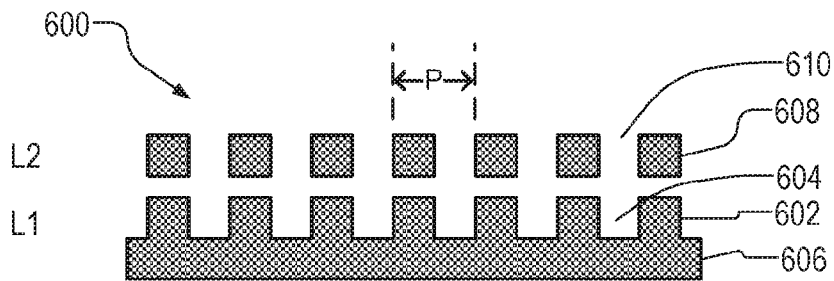
Fig. 7(a)
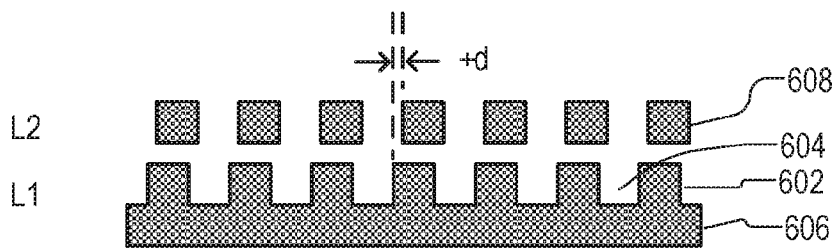
Fig. 7(b)
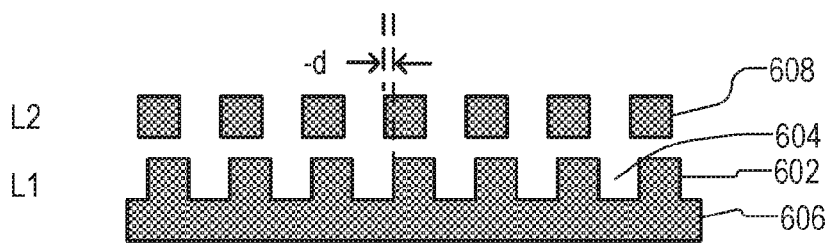
Fig. 7(c)
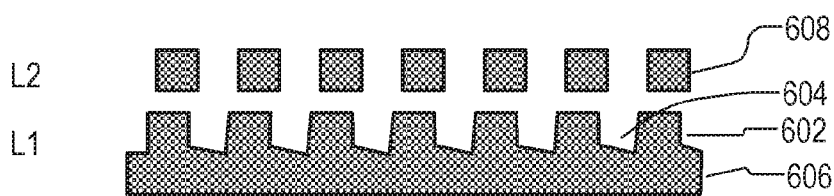
Fig. 7(d)
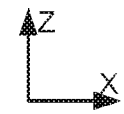

METROLOGY METHOD AND APPARATUS, COMPUTER PROGRAM AND LITHOGRAPHIC SYSTEM

CROSS REFERENCE TO RELATED APPLICATIONS

EP 15153851.9 is incorporated by reference herein in its entirety.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target structure and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The target structures used by conventional scatterometers are relatively large, e.g., 40 µm by 40 µm, gratings and the measurement beam generates a spot that is smaller than the grating (i.e., the grating is underfilled). This simplifies mathematical reconstruction of the target structure as it can be regarded as infinite. However, in order to reduce the size of the target structures, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such target structures are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller target structures. These target structures can be smaller than the illumination spot and may be surrounded by product structures on a wafer. Target structures can comprise multiple targets which can be measured in one image.

In the known metrology technique, overlay measurement results are obtained by measuring the target structure twice under certain conditions, while either rotating the target structure or changing the illumination mode or imaging mode to obtain separately the $-1^{st}$ and the $+1^{st}$ diffraction order intensities. The intensity asymmetry, a comparison of these diffraction order intensities, for a given target structure provides a measurement of target asymmetry, that is asymmetry in the target structure. This asymmetry in the target structure can be used as an indicator of overlay error (undesired misalignment of two layers).

Although the known dark-field image-based overlay measurements are fast and computationally very simple (once calibrated), they rely on an assumption that overlay (i.e., overlay error and deliberate bias) is the only cause of target asymmetry in the target structure. Any other asymmetry in the target structure, such as structural asymmetry of features within one or both of the overlaid gratings, also causes an intensity asymmetry in the $1^{st}$ (or other higher) orders. This intensity asymmetry attributable to structural asymmetry, and which is not related to overlay, clearly perturbs the overlay measurement, giving an inaccurate overlay measurement. Asymmetry in the lowermost or bottom grating of a target structure is a common form of structural asymmetry. It may originate for example in wafer processing steps such as chemical-mechanical polishing (CMP), performed after the bottom grating was originally formed.

Therefore, it is desired to distinguish the contributions to target asymmetry that are caused by overlay error and other effects in a more direct and simple way.

SUMMARY OF THE INVENTION

The invention in a first aspect provides a method of measuring a parameter of a lithographic process, the method comprising the steps of:

providing a plurality of target structures on a substrate, each target structure comprising a first structure and a second structure on different layers of the substrate;

measuring each target structure with measurement radiation to obtain a measurement of target asymmetry in the target structure, said target asymmetry comprising an overlay contribution due to misalignment of the first and second structures, and a structural contribution due to structural asymmetry in at least said first structure;

obtaining a structural asymmetry characteristic relating to the structural asymmetry in at least the first structure of each target structure, said structural asymmetry characteristic being independent of at least one selected characteristic of said measurement radiation; and determining the overlay contribution of the target asymmetry of each target structure from said measurement of target asymmetry and said structural asymmetry characteristic.

The invention in a second aspect provides a metrology apparatus for measuring a parameter of a lithographic process, the metrology apparatus being operable to perform the method of the first aspect. The metrology apparatus may comprise a support for said substrate having a plurality of target structures thereon; an optical system for performing said step of measuring each target structure; and a processor arranged to perform said step of determining the overlay contribution of the target asymmetry of each target structure.

The invention in a third aspect provides a lithographic system comprising:

a lithographic apparatus comprising:
an illumination optical system arranged to illuminate a pattern;
a projection optical system arranged to project an image of the pattern onto a substrate; and
a metrology apparatus according to the second aspect.

The invention further provides a computer program comprising processor readable instructions which, when run on suitable processor controlled apparatus, cause the processor controlled apparatus to perform the method of the first aspect, and a computer program carrier comprising such a computer program. The processor controlled apparatus may comprise the metrology apparatus of the second aspect or the lithographic system of the third aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIG. 3 comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIG. 7 (a) to (c) show schematic cross-sections of overlay gratings having different overlay values in the region of zero;

FIG. 7 (d) is a schematic cross-section of an overlay grating having structural asymmetry in a bottom grating due to processing effects;

DETAILED DESCRIPTION OF EXEMPLARY EMBODIMENTS

Before describing embodiments of the invention in detail, it is instructive to present an example environment in which embodiments of the present invention may be implemented.

Figure 1:
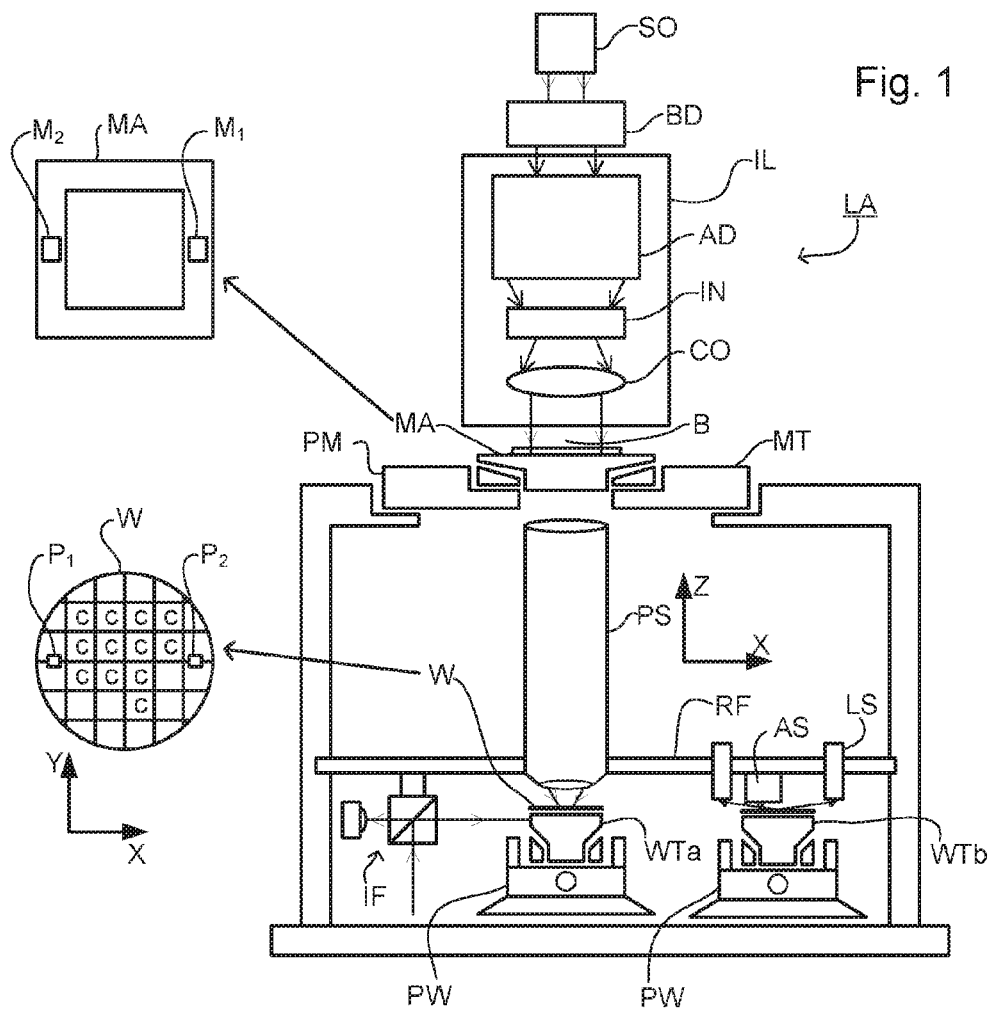
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
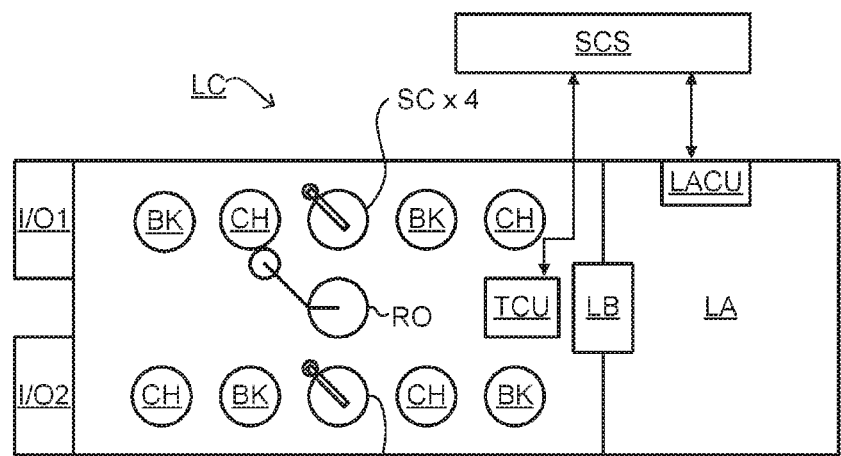
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus suitable for use in embodiments of the invention is shown in FIG. 3(a). A target structure T and diffracted rays of measurement radiation used to illuminate the target structure are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11

(e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line O) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts a target structure or composite target formed on a substrate according to known practice. The target structure in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target structure. A target structure may comprise more or fewer than 4 targets, or only a single target.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
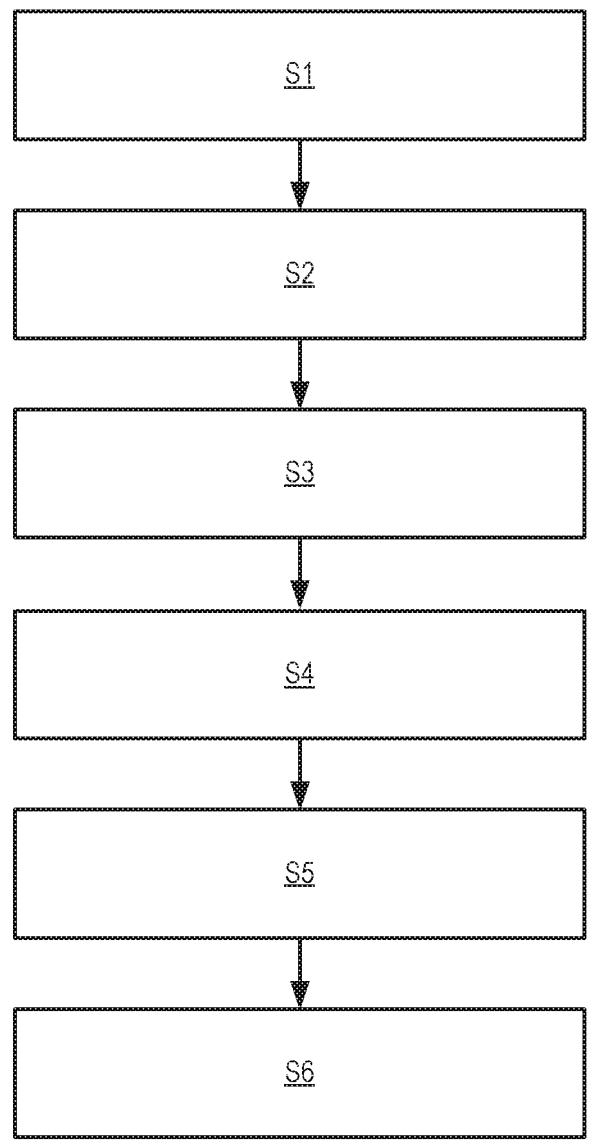
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error (i.e., undesired and unintentional overlay misalignment) between the two layers containing the component targets 32 to 35 is measured. This measurement is done through target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create a target structure including the targets 32-35. At S2, using the metrology apparatus of FIG. 3, an image of the targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual target lines of the targets will not be resolved. Each target will be represented simply by an area of a certain intensity level. In step S4, a region of interest (ROI) is identified within the image of each component target, from which intensity levels will be measured.

Having identified the ROI for each individual target and measured its intensity, the asymmetry of the target structure, and hence overlay error, can then be determined. This is done (e.g., by the processor PU) in step S5 comparing the intensity values obtained for +1 and −1 orders for each target 32-35 to identify their intensity asymmetry, e.g., any difference in their intensity. The term "difference" is not intended to refer only to subtraction. Differences may be calculated in ratio form. In step S6 the measured intensity asymmetries for a number of targets are used, together with knowledge of any known imposed overlay biases of those targets, to calculate one or more performance parameters of the lithographic process in the vicinity of the target structure T. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

FIG. 7 shows schematic cross sections of targets (overlay gratings), with different biases. These can be used as the target structure T on substrate W, as seen in FIGS. 3 and 4. Gratings with periodicity in the X direction are shown for the sake of example only. Different combinations of these gratings with different biases and with different orientations can be provided separately or as part of a target structure.

Starting with FIG. 7(a) a target 600 formed in two layers, labeled L1 and L2, is shown. In the lowermost or bottom layer L1, a first structure (the lowermost or bottom structure), for example a grating, is formed by features 602 and spaces 604 on a substrate 606. In layer L2 a second structure, for example a grating, is formed by features 608 and spaces 610. (The cross-section is drawn such that the features 602, 608 (e.g., lines) extend into the page.) The grating pattern repeats with a pitch P in both layers. Features 602 and 608 may take the form of lines, dots, blocks and via holes. In the situation shown at (a), there is no overlay contribution due to misalignment, e.g., no overlay error and no imposed bias, so that each feature 608 lies exactly over a feature 602 in the first structure.

At FIG. 7(b), the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At (c) we see another feature with a second known imposed bias −d, such that the features of 608 are shifted to the left. Biased targets of this type shown at (a) to (c) are well known in the art, and used in the prior applications mentioned above.

FIG. 7(d) shows schematically a phenomenon of structural asymmetry, in this case structural asymmetry in the first structure (bottom grating asymmetry). The features in the gratings at (a) to (c), are shown as perfectly square-sided, when a real feature would have some slope on the side, and a certain roughness. Nevertheless they are intended to be at least symmetrical in profile. The features 602 and/or spaces 604 at (d) in the first structure no longer have a symmetrical form at all, but rather have become distorted by processing steps. Thus, for example, a bottom surface of each space has become tilted. Side wall angles of the features and spaces have become asymmetrical also. As a result of this, the overall target asymmetry of a target will comprise an overlay contribution due to misalignment of the first structure and second structure (itself comprised of overlay error and any known imposed bias) and a structural contribution due to this structural asymmetry in the target.

When overlay is measured by the method of FIG. 6 using only two biased gratings, the process-induced structural asymmetry cannot be distinguished from the overlay contribution due to misalignment, and overlay measurements (in particular to measure the undesired overlay error) become unreliable as a result. Structural asymmetry in the first structure (bottom grating) of a target structure is a common form of structural asymmetry. It may originate, for example, in the substrate processing steps such as chemical-mechanical polishing (CMP), performed after the first structure was originally formed.

In WO 2013143814 A1, mentioned above, it is proposed to use of three or more component targets to measure overlay by a modified version of the method of FIG. 6. Using three or more targets of the type shown in FIGS. 7(a) to (c) are used to obtain overlay measurements that are to some extent corrected for structural asymmetry in the target gratings, such as is caused by bottom grating asymmetry in a practical lithographic process. However, this method requires a new target structure design (e.g. different to that illustrated in FIG. 4) and therefore a new reticle will be required. Furthermore, the target structure area is larger and therefore consumes more substrate area.

Figure 8:
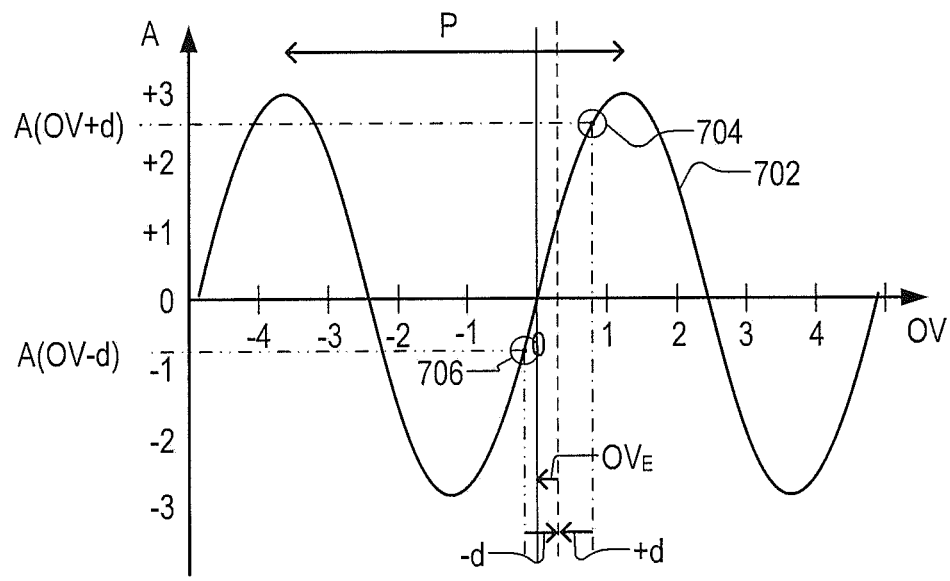
FIG. 8 illustrates known principles of overlay measurement in an ideal target structure, not subject to structural asymmetry.
Figure 9:
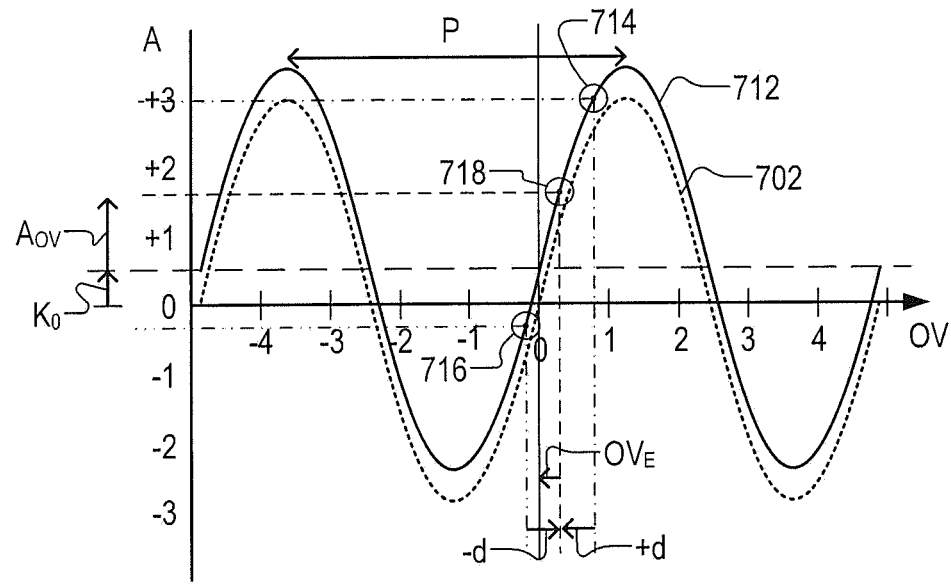
FIG. 9 illustrates a known principle of overlay measurement in a non-ideal target structure, with correction of structural asymmetry as disclosed in WO 2013143814 A1.

In FIG. 8 a curve 702 illustrates the relationship between overlay OV and intensity asymmetry A for an 'ideal' target structure having zero offset and no structural asymmetry within the individual gratings forming the target structure. Consequently, the target asymmetry of this ideal target structure comprises only an overlay contribution due to misalignment of the first structure and second structure resultant from a known imposed bias and overlay error. This graph, and the graph of FIG. 9, is to illustrate the principles behind the disclosure only, and in each graph, the units of intensity asymmetry A and overlay OV are arbitrary. Examples of actual dimensions will be given further below.

In the 'ideal' situation of FIG. 8, the curve 702 indicates that the intensity asymmetry A has a non-linear periodic relationship (e.g., sinusoidal relationship) with the overlay. The period P of the sinusoidal variation corresponds to the period or pitch P of the gratings, converted of course to an appropriate scale. The sinusoidal form is pure in this example, but can include harmonics in real circumstances.

As mentioned above, biased gratings (having a known imposed overlay bias) can be used to measure overlay, rather than relying on a single measurement. This bias has a known value defined in the patterning device (e.g. a reticle) from which it was made, that serves as an on-wafer calibration of the overlay corresponding to the measured intensity asymmetry. In the drawing, the calculation is illustrated graphically. In steps S1-S5, intensity asymmetry measurements $A_{+d}$ and $A_{-d}$ are obtained for targets having imposed biases +d an -d respectively (as shown in FIGS. 7 (b) and (c), for example). Fitting these measurements to the sinusoidal curve gives points 704 and 706 as shown. Knowing the biases, the true overlay error $OV_E$ can be calculated. The pitch P of the sinusoidal curve is known from the design of the target structure. The vertical scale of the curve 702 is not known to start with, but is an unknown factor which can be referred to as a $1^{st}$ harmonic proportionality constant, $K_1$. This constant $K_1$ is a measure of the sensitivity of the intensity asymmetry measurements to the target structure.

In equation terms, the relationship between overlay error $OV_E$ and intensity asymmetry A is assumed to be:

$$A_{\pm d} = K_1 \sin(OV_E \pm d) \quad (1)$$

where overlay error $OV_E$ is expressed on a scale such that the target pitch P corresponds to an angle $2\pi$ radians. Using two measurements of targets with different, known biases (e.g. +d and -d) the overlay error $OV_E$ can be calculated using:

$$OV_E = \operatorname{atan}\left(\frac{A_{+d} + A_{-d}}{A_{+d} - A_{-d}} \cdot \tan(d)\right) \quad (2)$$

FIG. 9 shows a first effect of introducing structural asymmetry, for example the bottom grating asymmetry illustrated in FIG. 7(d). The 'ideal' sinusoidal curve 702 no longer applies. However, at least approximately, bottom grating asymmetry or other structural asymmetry has the effect of adding an offset term to the intensity asymmetry A, which is relatively constant across all overlay values. The resulting curve is shown as 712 in the diagram, with label $K_0$ indicating the offset term due to structural asymmetry. Offset term $K_0$ is dependent upon a selected characteristic of the measurement radiation, such as the wavelength and polarization of the measurement radiation (the "measurement recipe"), and is sensitive to process variations. In equation terms, the relationship used for calculation in step S6 becomes:

$$A_{\pm d} = K_0 + K_1 \sin(OV_E \pm d) \quad (3)$$

Where there is structural asymmetry, the overlay model described by Equation (2) will provide overlay error values which are impacted by the additional offset term $K_0$, and will be consequently inaccurate. By providing a target structure with multiple targets with a biasing scheme having three or more different bias values, the prior application WO 2013143814 A1 seeks to obtain accurate overlay measurements by fitting the measurements to the offset sine curve 712 and eliminating the constant offset term $K_0$.

Detailed examples of the modified measurement and calculations are given in the prior application for various different biasing schemes. For a simple example to illustrate the principle, FIG. 9 shows three measurement points 714, 716 and 718 fitted to the curve 712. The points 714 and 716 are measured from targets having bias +d and -d, the same as for the points 704 and 706 in FIG. 7. A third asymmetry measurement from a grating with zero bias (in this example) is plotted at 718. Fitting the curve to three points allows the (constant) offset term $K_0$ that is due to structural asymmetry to be separated from the sinusoidal contribution $A_{OV}$ that is due to overlay error, so that the overlay error can be calculated more accurately. As already mentioned, a major drawback with this approach is the requirement of a modified target structure.

As noted already, the overlay calculations of modified step S6 rely on certain assumptions. Firstly, it is assumed that $1^{st}$ order intensity asymmetry due to the structural asymmetry (for example BGA) is independent of the overlay for the overlay range of interest, and as a result it can be described by a constant offset term $K_0$. Another assumption is that intensity asymmetry behaves as a sine function of the overlay, with the period P corresponding to the grating pitch. These assumptions are valid for present overlay ranges. The number of harmonics can be designed to be small, because the small pitch-wavelength ratio only allows for a small number of propagating diffraction orders from the grating. However, in practice the overlay contribution to the intensity asymmetry due to misalignment may not be only sinusoidal, and may not be symmetrical about OV=0. The "phase" contribution or the "horizontal shift", which can also result from target deformation, is neglected in Equation (3) as well as in the remainder of this disclosure.

It is proposed to model that target asymmetry of a target structure, and therefore overlay, based on a variation of Equation (3), which does not neglect the effect of the structural asymmetry, while allowing the use of current target structure designs such as those illustrated in FIG. 4. This modelling may be performed as a modification to step S6 in the method illustrated in FIG. 6.

The proposed method assumes that there is a linear relationship between a structural asymmetry characteristic (i.e., pattern or fingerprint) observed over the substrate resulting from structural asymmetry and the effect on the offset term $K_0$ of the overlay response curve. The sensitivity of this linear relationship varies with the measurement recipe, but the underlying fingerprint is assumed to be stable and unvarying. This assumption is valid for small structural asymmetry, and is supported by observation. By combining measurement results of two or more measurement recipe settings, both the fingerprint and the sensitivity can be determined and, from this, the overlay can be calculated more accurately compared to known techniques.

Equation (3) can be written as a first asymmetry parameter and a second asymmetry parameter, and more specifically as a difference asymmetry parameter $A_\Delta(i,\lambda)$ and sum asymmetry parameter $A_\Sigma(i,\lambda)$. Both of these asymmetry parameters are dependent upon the target measured i and the measurement recipe $\lambda$. The asymmetry parameters may be determined from direct measurements on a number of targets using different measurement recipes. The sum asymmetry parameter is defined as:

$$A_\Sigma(i,\lambda) \equiv A_{+d}(i,\lambda) + A_{-d}(i,\lambda) = 2K_0(i,\lambda) + 2K_1(i,\lambda) \cdot \cos(d) \cdot \sin(OV_{Ei}) \quad (4)$$

The difference asymmetry parameter is defined as:

$$A_\Delta(i,\lambda) \equiv A_{+d}(i,\lambda) + A_{-d}(i,\lambda) = 2K_1(i,\lambda) \cdot \sin(d) \cdot \cos(OV_{Ei}) \quad (5)$$

The inventors have determined that for different measurement recipes and different stacks (e.g., materials used in the structure and its processing), a mapping of the structural asymmetry of a target structure (i.e., maps of offset term $K_0$) over a substrate shows an identical (or very similar) pattern, with only the sensitivity varying between measurement recipes. This structural asymmetry may be almost entirely due to structural asymmetry in the bottom grating structure, as manufacturing techniques in the subsequent layers tend to result in substantially symmetrical structures in these subsequent layers.

As a consequence of this, the offset term $K_0(i,\lambda)$ of Equation (4), which describes the structural asymmetry map of the substrate, can be recast as:

$$K_0(i,\lambda) = a(\lambda) \cdot K_{0fpt}(i) \quad (6)$$

Structural asymmetry characteristic $K_{0fpt}(i)$ is a dimensionless parameter which describes the "fingerprint" of the structural asymmetry map in terms of the target i, and is independent of the measurement recipe $\lambda$. Scalar factor $a(\lambda)$ describes the sensitivity variation of the asymmetry map in terms of the measurement recipe used. It comprises a single scalar factor per measurement recipe $\lambda$, and target orientation.

In many practical embodiments, the target structure will comprise one or more first oriented targets having a first orientation with respect to the measurement radiation (i.e., an x-direction oriented target) and one or more second oriented targets having a second orientation with respect to the measurement radiation (i.e., a y-direction oriented target), such that the first oriented targets and second oriented targets are oriented at 90 degrees with respect to each other. For example, the target structures may take a form the same or similar to that illustrated in FIG. 4. It should be appreciated that the x-direction oriented targets may be differently sensitive to the measurement radiation compared to the y-direction oriented targets. Consequently, the scalar factor term may be different for x-direction oriented targets $a(\lambda)_x$ and y-direction oriented targets $a(\lambda)_y$, with respect to the measurement radiation. Similarly, the structural asymmetry characteristic may be different for x-direction oriented targets $K_{0fpt}(i)_x$ and y-direction oriented targets $K_{0fpt}(i)_y$, with respect to the measurement radiation. In this way, overlay can be modelled separately in the x and y directions (although the measurements in the two directions may be performed simultaneously using the target structure of FIG. 4).

Figure 10A:
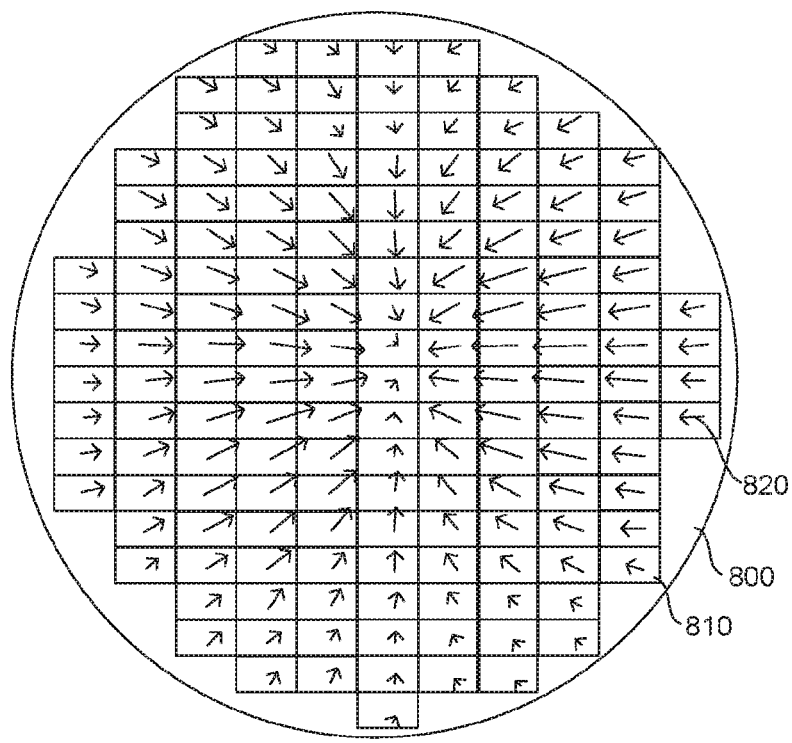
FIG. 10 shows a structural asymmetry map of target structures measured using (a) a first measurement recipe and (b) a second measurement recipe.
Figure 10B:
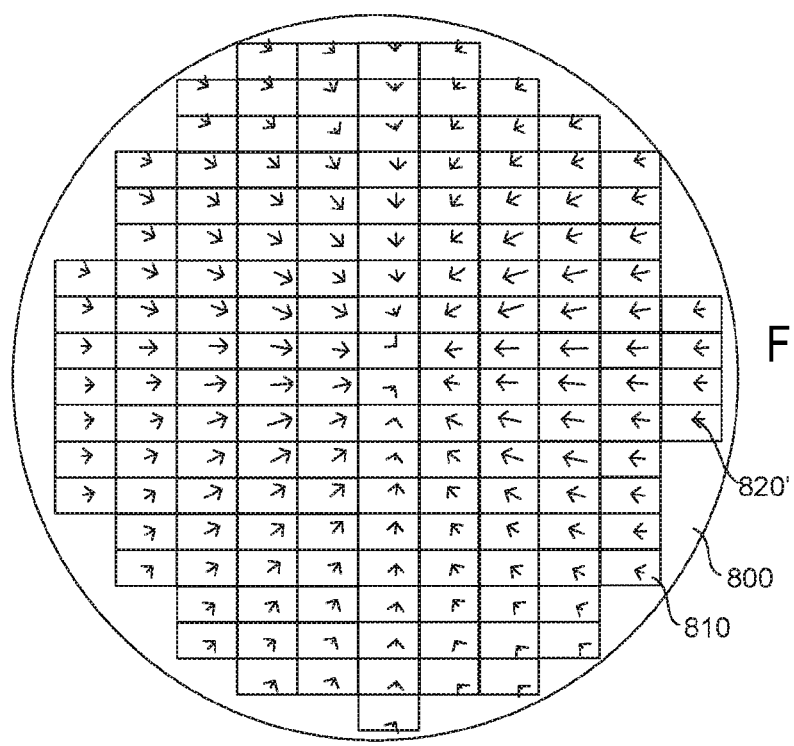

FIG. 10 illustrates this concept, and shows a structural asymmetry map of target structures measured using (a) a first measurement recipe and (b) a second measurement recipe. In each drawing, there is shown a representation of a substrate 800, comprising fields 810. Within each field 810 is an arrow 820, 820' representing the offset term $K_0(i,\lambda)$ (structural asymmetry for that field). Each arrow 820, 820' is a 2-dimensional vector representation of two components: a measurement from the x-direction oriented target and a measurement from the y-direction oriented target. The x-direction oriented targets and y-direction oriented targets within a single target structure are physically at different locations (which can be tens of micrometers apart), but in FIG. 10 are represented by a single arrow as if they were at the same location.

In FIGS. 10(*a*) and 10(*b*), the x-direction and y-direction oriented targets have the same sensitivity to the measurement radiation such that $a(\lambda)_x = a(\lambda)_y$. As already described, this will not necessarily be true. However it helps clarify the principle behind this disclosure as it causes corresponding arrows to be aligned in the same directions in both FIGS. 10(*a*) and 10(*b*), thereby making it clearer that there is a common fingerprint pattern in both figures.

The target structures are the same in FIGS. 10(*a*) and 10(*b*), only one or more characteristics of the measurement radiation (i.e., the measurement recipe) has changed. It should be apparent that the overall pattern or fingerprint across the substrate is essentially the same in FIGS. 10(*a*) and 10(*b*). It can be seen that the relative length of each arrow 820, 820', with respect to the other arrows in the same drawing, is the same in FIGS. 10(*a*) and 10(*b*). For example, where an arrow 820 in a first field 810 is twice as long as an arrow 820 in a second field 810 in FIG. 10(*a*), the arrows 820' in the fields corresponding to the first field and second field in FIG. 10(*b*) will show the same relationship. Also, as a consequence of $a(\lambda)_x = a(\lambda)_y$, the direction of each arrow 820 in FIG. 10(*a*) is the same as the direction of the corresponding arrow 820' in FIG. 10(*b*). The lengths of the arrows 820, 820' relative to each other across the substrate 800, and the direction of the arrows 820, 820', provides a representation of the structural asymmetry characteristic $K_{0fpt}(i)$.

The structural asymmetry characteristic $K_{0fpt}(i)$ is a dimensionless parameter. Application of scalar factor $a(\lambda)$ provides the actual magnitude of the offset term $K_0(i,\lambda)$ for structural asymmetry. It can be seen that the lengths of the arrows in one of FIG. 10(*a*) or 10(*b*) relative to the other differs by a constant factor, the scalar factor $a(\lambda)$, across all the fields 810. Consequently, the length of each arrow 820 in FIG. 10(*a*) relative to the corresponding arrow 820' in FIG. 10(*b*) provides an indication of the scalar factor $a(\lambda)$. Each arrow 820' in this specific illustrative example is half the length of its corresponding arrow 820.

The structural asymmetry characteristic $K_{0fpt}(i)$ can be directly measured. This direct measurement may comprise an asymmetry measurement on the first structure (bottom grating) of a target. It may be performed before exposure of subsequent layers or before coating of the substrate. The measurement of structural asymmetry characteristic $K_{0fpt}(i)$ can be performed using inspection apparatus such as that described herein. Separate measurements of the structural asymmetry characteristic $K_{0fpt}(i)$ can be made on x-oriented targets and y-oriented targets of each target structure, to enable separate modelling of the overlay in the x-direction and y-direction as described below.

Combining Equations (4), (5) and (6) yields:

$$A_\Sigma(i, \lambda) = a(\lambda) \cdot 2K_{0fpt}(i) + A_\Delta(i, \lambda) \cdot \frac{\tan(OV_{Ei})}{\tan(d)} \quad (7)$$

From Equation (7) it becomes apparent that it is possible to solve for the overlay error $OV_{Ei}$, if:

1) Structural asymmetry (e.g. Bottom Grating Asymmetry), and therefore the structural asymmetry characteristic, is known. As already mentioned, this can be directly measured.

2) Intensity asymmetry (A) measurements are performed using at least two different measurement recipes; and 3) More than two target structures are measured on the substrate. These target structures can be the same or similar, this requirement simply ensuring that there are more rows than columns in the design matrix. Consequently the minimum number of target structures that need to be measured will depend on the actual form of the design matrix; for example, a method based on using Equation (11) below will require an increase in the minimum number of target structures to be measured.

If N targets 1, 2, ..., n are measured using M different measurement recipes $\lambda_1, \lambda_2, \ldots, \lambda_m$, overlay can be solved using:

$$\begin{pmatrix} A_\Sigma(1, \lambda_1) \\ A_\Sigma(2, \lambda_1) \\ \vdots \\ A_\Sigma(i, \lambda_1) \\ A_\Sigma(1, \lambda_2) \\ A_\Sigma(2, \lambda_2) \\ \vdots \\ A_\Sigma(i, \lambda_2) \\ \vdots \\ A_\Sigma(i, \lambda_m) \end{pmatrix} = X \cdot \begin{pmatrix} a(\lambda_1) \\ a(\lambda_2) \\ \vdots \\ a(\lambda_m) \\ \tan(OV_{E1})/\tan(d) \\ \tan(OV_{E2})/\tan(d) \\ \vdots \\ \tan(OV_{Ei})/\tan(d) \end{pmatrix} \quad (8)$$

with the design matrix X taking the form:

$$\begin{pmatrix} 2K_{0fpt}(1) & 0 & \cdots & 0 & A_\Delta(1, \lambda_1) & 0 & \cdots & 0 \\ 2K_{0fpt}(2) & 0 & \cdots & 0 & 0 & A_\Delta(2, \lambda_1) & \cdots & 0 \\ \vdots & \vdots & \ddots & \vdots & \vdots & \vdots & \ddots & \vdots \\ 2K_{0fpt}(i) & 0 & \cdots & 0 & 0 & 0 & \cdots & A_\Delta(i, \lambda_1) \\ 0 & 2K_{0fpt}(1) & \cdots & 0 & A_\Delta(1, \lambda_2) & 0 & \cdots & 0 \\ 0 & 2K_{0fpt}(2) & \cdots & 0 & 0 & A_\Delta(2, \lambda_2) & \cdots & 0 \\ \vdots & \vdots & \ddots & \vdots & \vdots & \vdots & \ddots & \vdots \\ 0 & 2K_{0fpt}(i) & \cdots & 0 & 0 & 0 & \cdots & A_\Delta(i, \lambda_2) \\ \vdots & \vdots & \ddots & \vdots & \vdots & \vdots & \ddots & \vdots \\ 0 & 0 & \cdots & 2K_{0fpt}(i) & 0 & 0 & \cdots & A_\Delta(i, \lambda_m) \end{pmatrix}$$

Equation (8) is the proposed new overlay model. The response vector comprises the second (sum) intensity asymmetry parameter $A_\Sigma(i,\lambda_m)$. The vector of parameters to be solved for comprises the bottom grating asymmetry scalar factors $a(\lambda_1), a(\lambda_2), \ldots, a(\lambda_m)$ and the overlay contribution parameters $(\tan(OV_{Ei}))/(\tan(d))$, and therefore the overlay error parameter $OV_{E1}, OV_{E2}, \ldots, OV_{Ei}$. The design matrix comprises first (difference) intensity asymmetry parameter $A_\Delta(i,\lambda_m)$ and the structural asymmetry characteristic $K_{0fpt}(i)$.

As previously mentioned, the target structure may comprise x-direction oriented targets and y-direction oriented targets which may be differently sensitive to the measurement radiation. As a consequence, in such an embodiment, the overall model described in Equation (8) will be composed of two such equations. A first equation will be populated with measurements of the x-oriented targets $A_\Sigma(i, \lambda_m)_x$, $A_\Delta(i,\lambda_m)_x$ and $K_{Ofpt}(i)_x$ for which the determined scalar factor will be $a(\lambda_m)_x$, the model yielding overlay in the x-direction $\tan(OV_{E1})_x$. Similarly a second equation will be populated with measurements of the y-oriented targets $A_\Sigma(i, \lambda_m)_y$, $A_\Delta(i,\lambda_m)_y$ and $K_{Ofpt}(i)_y$ for which the determined scalar factor will be $a(\lambda_m)_y$, the model yielding overlay in the y-direction $\tan(OV_{E1})_y$. Of course, constructing the model separately in terms of the x-direction oriented targets and y-direction oriented targets is equally applicable to any such models falling within the scope of this disclosure, including those explicitly disclosed below.

In a specific example, i targets may be measured using two measurement recipes $\lambda_1$ and $\lambda_2$. In this example, the overlay model is:

$$\begin{pmatrix} A_\Sigma(1,\lambda_1) \\ A_\Sigma(2,\lambda_1) \\ \vdots \\ A_\Sigma(i,\lambda_1) \\ A_\Sigma(1,\lambda_2) \\ A_\Sigma(2,\lambda_2) \\ \vdots \\ A_\Sigma(i,\lambda_2) \end{pmatrix} = X \cdot \begin{pmatrix} a(\lambda_1) \\ a(\lambda_2) \\ \tan(OV_{E1})/\tan(d) \\ \tan(OV_{E2})/\tan(d) \\ \vdots \\ \tan(OV_{Ei})/\tan(d) \end{pmatrix} \quad (9)$$

and the design matrix X is:

$$\begin{pmatrix} 2K_{0fpt}(1) & 0 & A_\Delta(1,\lambda_1) & 0 & \dots & 0 \\ 2K_{0fpt}(2) & 0 & 0 & A_\Delta(2,\lambda_1) & \dots & 0 \\ \vdots & \vdots & \vdots & \vdots & \ddots & \vdots \\ 2K_{0fpt}(i) & 0 & 0 & 0 & \dots & A_\Delta(i,\lambda_1) \\ 0 & 2K_{0fpt}(1) & A_\Delta(1,\lambda_2) & 0 & \dots & 0 \\ 0 & 2K_{0fpt}(2) & 0 & A_\Delta(2,\lambda_2) & \dots & 0 \\ \vdots & \vdots & \vdots & \vdots & \ddots & \vdots \\ 0 & 2K_{0fpt}(i) & 0 & 0 & \dots & A_\Delta(i,\lambda_2) \end{pmatrix}$$

In practice, structural asymmetry characteristic $K_{Ofpt}(i)$ may comprise a linear combination of different structural asymmetry characteristics $K_{Ofpt1}(i)$, $K_{Ofpt2}(i)$ ... $K_{Ofptn}(i)$ which have different sensitivity $a_1(\lambda)$, $a_2(\lambda)$ ... $a_n(\lambda)$ to the stack. An example could be an etched wafer which thereafter was subject to chemical-mechanical polishing (CMP). In this example the first structural asymmetry characteristic $K_{Ofpt1}(i)$ could be a (high-order) scaling caused by the etching step, and the second structural asymmetry characteristic $K_{Ofpt2}(i)$ could be a (high-order) rotation caused by the CMP process. In this case Equation (6) becomes:

$$K_0(i,\lambda) = a_1(\lambda) \cdot K_{Ofpt1}(i) + a_2(\lambda) \cdot K_{Ofpt2}(i) \dots + a_n(\lambda) \cdot K_{Ofptn}(i) \quad (10)$$

Consequently, using the example of two different measurement recipes described by Equation (9) (i.e., assuming n=2 for simplicity), Equation (9) becomes:

$$\begin{pmatrix} A_\Sigma(1,\lambda_1) \\ A_\Sigma(2,\lambda_1) \\ \vdots \\ A_\Sigma(i,\lambda_1) \\ A_\Sigma(1,\lambda_2) \\ A_\Sigma(2,\lambda_2) \\ \vdots \\ A_\Sigma(i,\lambda_2) \end{pmatrix} = X \cdot \begin{pmatrix} a_1(\lambda_1) \\ a_1(\lambda_2) \\ a_2(\lambda_1) \\ a_2(\lambda_2) \\ \tan(OV_{E1})/\tan(d) \\ \tan(OV_{E2})/\tan(d) \\ \vdots \\ \tan(OV_{Ei})/\tan(d) \end{pmatrix} \quad (11)$$

where the design matrix X takes the form:

$$\begin{pmatrix} 2K_{0fpt1}(1) & 0 & 2K_{0fpt2}(1) & 0 & A_\Delta(1,\lambda_1) & 0 & \dots & 0 \\ 2K_{0fpt1}(2) & 0 & 2K_{0fpt2}(2) & 0 & 0 & A_\Delta(2,\lambda_1) & \dots & 0 \\ \vdots & \vdots & \vdots & \vdots & \vdots & \vdots & \ddots & \vdots \\ 2K_{0fpt1}(i) & 0 & 2K_{0fpt2}(i) & 0 & 0 & 0 & \dots & A_\Delta(i,\lambda_1) \\ 0 & 2K_{0fpt1}(1) & 0 & 2K_{0fpt2}(1) & A_\Delta(1,\lambda_2) & 0 & \dots & 0 \\ 0 & 2K_{0fpt1}(2) & 0 & 2K_{0fpt2}(2) & 0 & A_\Delta(2,\lambda_2) & \dots & 0 \\ \vdots & \vdots & \vdots & \vdots & \vdots & \vdots & \ddots & \vdots \\ 0 & 2K_{0fpt1}(i) & 0 & 2K_{0fpt2}(i) & 0 & 0 & \dots & A_\Delta(i,\lambda_2) \end{pmatrix}$$

To directly measure the structural asymmetry characteristic $K_{Ofpt}(i)$, a methodology similar to standard overlay measurements (to obtain intensity asymmetries), as depicted in FIG. 6, is performed on the first structure (bottom grating) before the exposure of the second layer and therefore the formation of a second structure. Of course, as there is only the single layer being measured, there cannot be any overlay and the +d and −d "bias" of the target is not real (without a second layer, the +d "biased" target and the −d "biased" target will be in fact identical). The bottom grating asymmetry can then be calculated (per target) using:

$$A = \frac{I^+_{+d} - I^-_{+d} + I^+_{-d} - I^-_{-d}}{I^+_{+d} + I^-_{+d} + I^+_{-d} + I^-_{-d}} \quad (12)$$

where I is the measured intensity, the + and − superscript denoting the order of the measurement radiation beam and the +d and −d subscript denoting the target "bias" (e.g., $I^+_{+d}$ is the measured intensity when measuring a positively biased target using +1 order measurement illumination and $I^-_{+d}$ is the measured intensity when measuring a positively biased target using −1 order measurement illumination.

Once the bottom grating asymmetry A is obtained for all target structures, the structural asymmetry characteristic $K_{0fpt}$ (i) can then be extracted. This can be achieved manually, or using data driven pattern recognition techniques such as principal component analysis (PCA).

Using the novel calculations disclosed herein, overlay measurements can be made that are significantly more robust to undesired structure asymmetries in the overlay metrology target structure, e.g. from wafer processing, while maintaining the current 2-bias target structure design. The methods can be used at manufacturing sites using existing metrology apparatus without the requirement for any sensor hardware change, or reticle change. There will be no increase in the substrate area taken up by the target structure (although throughput will be reduced when measuring using more than one measurement recipe). The measured offset term $K_0(i,\lambda)$, which provides an indication of sensitivity to structural asymmetry, can be used for process stability monitoring.

While the target structures described above are metrology target structures specifically designed and formed for the purposes of measurement, in other embodiments, properties may be measured on target structures which are functional parts of devices formed on the substrate. Many devices have regular, grating-like structures. The terms 'target grating' and 'target structure' as used herein do not require that the structure has been provided specifically for the measurement being performed. Further, pitch P of the metrology target structures is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to structural asymmetry.

The program may optionally be arranged to control the optical system, substrate support and the like to perform the steps S2-S5 for measurement of asymmetry on a suitable plurality of target structures.

While the embodiments disclosed above are described in terms of diffraction based overlay measurements (e.g., measurements made using the second measurement branch of the apparatus shown in FIG. 3(a)), in principle the same models can be used for pupil based overlay measurements (e.g., measurements made using the first measurement branch of the apparatus shown in FIG. 3(a)). Consequently, it should be appreciated that the concepts described herein are equally applicable to diffraction based overlay measurements and pupil based overlay measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Further embodiments according to the present invention are provided in below numbered clauses:

1. A method of measuring a parameter of a lithographic process, the method comprising the steps of:

providing a plurality of target structures on a substrate, each target structure comprising a first structure and a second structure on different layers of the substrate;

measuring each target structure with measurement radiation to obtain a measurement of target asymmetry in the target structure, said target asymmetry comprising an overlay contribution due to misalignment of the first and second structures, and a structural contribution due to structural asymmetry in at least said first structure;

obtaining a structural asymmetry characteristic relating to the structural asymmetry in at least the first structure of each target structure, said structural asymmetry characteristic being independent of at least one selected characteristic of said measurement radiation; and determining the overlay contribution of the target asymmetry of each target structure from said measurement of target asymmetry and said structural asymmetry characteristic.

2. A method according to clause 1 wherein said structural asymmetry characteristic comprises a dimensionless fingerprint characteristic of at least the first structure of each target structure.

3. A method according to clause 1 or 2 wherein said measuring of said target structure comprises:

illuminating the target structures with said measurement radiation and detecting the measurement radiation scattered by each target structure; and measuring intensity asymmetry in corresponding higher orders of the scattered measurement radiation;

4. A method according to clause 3 wherein said step of determining the overlay contribution of the target asymmetry, comprises assuming that there is a non-linear periodic relationship between intensity asymmetry and the overlay contribution of the target asymmetry, said non-linear periodic relationship including an offset term related to the structural asymmetry;

5. A method according to clause 4 wherein said offset term is composed of said structural asymmetry characteristic, scaled by a scalar factor, wherein said scalar factor is constant for all of said plurality of target structures when measured in at least a first orientation with respect to the measurement radiation, and dependent upon said at least one selected characteristic of the measurement radiation.

6. A method according to clause 5 comprising constructing an overlay model, said overlay model comprising:

a design matrix parameterized by said structural asymmetry characteristic and a first intensity asymmetry parameter related to the measurements of intensity asymmetry;

a response vector parameterized by a second intensity asymmetry parameter related to the measurements of intensity asymmetry; and a vector of parameters to be solved for, parameterized by an overlay contribution parameter describing said overlay contribution of the target asymmetry and said scalar factor.

7. A method according to clause 6 wherein said target structure comprises at least two targets, a first oriented target having a first orientation with respect to the measurement radiation and a second oriented target having a second orientation with respect to the measurement radiation; and said overlay model comprises a first overlay model for modeling overlay in the direction of said first orientation based on measurements of said first oriented target and a second overlay model for modeling overlay in the direction of said second orientation based on measurements of said second oriented target.

8. A method according to clause 7 wherein the first overlay model comprises a first scalar factor and said second overlay model comprises a second scalar factor.

9. A method according to clause 7 or 8 wherein the first overlay model comprises a first structural asymmetry characteristic and said second overlay model comprises a second structural asymmetry characteristic.

10. A method according to any of clauses 6 to 9 wherein said step of determining the overlay contribution of the target asymmetry comprises using said model to solve for said overlay contribution parameter.

11. A method according to any of clauses 6 to 10 wherein each of said target structures comprise at least two targets, a first target with a first known imposed bias and a second target with a second known imposed bias, and wherein:

said first asymmetry parameter comprises the difference of asymmetry measurements obtained from said first target and said second target; and said second asymmetry parameter comprises the sum of asymmetry measurements obtained from said first target and said second target.

12. A method according to any preceding clause comprising making direct measurements of the first structure, and using said direct measurements to obtain said structural asymmetry characteristic.

13. A method according to clause 12 wherein said first structure is the lowermost structure on the substrate, and said direct measurement of the first structure prior is made prior to the formation of the second structure.

14. A method according to any preceding clause wherein said overlay contribution of the target asymmetry comprises a contribution due to a known imposed bias and a contribution due to an overlay error, and said method comprises determining the contribution due to an overlay error.

15. A method according to any preceding clause comprising performing said measuring of each target structure a plurality of times, each time using measurement radiation wherein said at least one selected characteristic is varied.

16. A method according to any preceding clause wherein said at least one selected characteristic comprises wavelength and/or polarization.

17. A method according to any preceding clause wherein said step of obtaining a structural asymmetry characteristic comprises obtaining a linear combination of a plurality of structural asymmetry characteristics, each structural asymmetry characteristic being the result of a different processing step.

18. A metrology apparatus for measuring a parameter of a lithographic process, the metrology apparatus being operable to perform the method of any of clauses 1 to 17.

19. A metrology apparatus according to clause 18 comprising:

a support for said substrate having a plurality of target structures thereon;

an optical system for performing said step of measuring each target structure; and a processor arranged to perform said step of determining the overlay contribution of the target asymmetry of each target structure.

20. A lithographic system comprising:

a lithographic apparatus comprising:

an illumination optical system arranged to illuminate a pattern;

a projection optical system arranged to project an image of the pattern onto a substrate; and a metrology apparatus according to any clause 18 or 19, wherein the lithographic apparatus is arranged to use the determined overlay contribution calculated by the metrology apparatus in applying the pattern to further substrates.

21. A computer program comprising processor readable instructions which, when run on suitable processor controlled apparatus, cause the processor controlled apparatus to perform the method of any one of clauses 1 to 17.

22. A computer program carrier comprising the computer program of clause 21.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

providing a plurality of target structures on a substrate, each target structure comprising a first structure and a second structure on different layers of the substrate;

measuring each target structure with measurement radiation to obtain a measurement of target asymmetry in the target structure, said target asymmetry comprising an overlay contribution due to misalignment of the first and second structures and a structural contribution due to structural asymmetry in at least said first structure;

obtaining a structural asymmetry characteristic relating to the structural asymmetry in at least the first structure of each target structure, said structural asymmetry characteristic being independent of at least one selected characteristic of said measurement radiation; and determining the overlay contribution of the target asymmetry of each target structure from said measurement of target asymmetry and said structural asymmetry characteristic.

2. The method as claimed in claim 1, wherein said structural asymmetry characteristic comprises a dimensionless fingerprint characteristic of at least the first structure of each target structure.

3. The method as claimed in claim 1, wherein said measuring of said target structure comprises:
illuminating the target structures with said measurement radiation;
detecting the measurement radiation scattered by each target structure; and
measuring intensity asymmetry in corresponding higher orders of the scattered measurement radiation.

4. The method as claimed in claim 3, wherein said determining the overlay contribution of the target asymmetry comprises:
assuming that there is a non-linear periodic relationship between intensity asymmetry and the overlay contribution of the target asymmetry, said non-linear periodic relationship including an offset term related to the structural asymmetry.

5. The method as claimed in claim 4, wherein said offset term is composed of said structural asymmetry characteristic, scaled by a scalar factor, wherein said scalar factor is constant for all of said plurality of target structures when measured in at least a first orientation with respect to the measurement radiation, and dependent upon said at least one selected characteristic of the measurement radiation.

6. The method as claimed in claim 5, comprising constructing an overlay model, said overlay model comprising:
a design matrix parameterized by said structural asymmetry characteristic and a first intensity asymmetry parameter related to the measurements of intensity asymmetry;
a response vector parameterized by a second intensity asymmetry parameter related to the measurements of intensity asymmetry; and
a vector of parameters to be solved for, parameterized by an overlay contribution parameter describing said overlay contribution of the target asymmetry and said scalar factor.

7. The method as claimed in claim 6, wherein said target structure comprises at least two targets, a first oriented target having a first orientation with respect to the measurement radiation and a second oriented target having a second orientation with respect to the measurement radiation; and
said overlay model comprises a first overlay model for modeling overlay in the direction of said first orientation based on measurements of said first oriented target and a second overlay model for modeling overlay in the direction of said second orientation based on measurements of said second oriented target.

8. The method as claimed in claim 7, wherein the first overlay model comprises a first scalar factor and said second overlay model comprises a second scalar factor.

9. The method as claimed in claim 7, wherein the first overlay model comprises a first structural asymmetry characteristic and said second overlay model comprises a second structural asymmetry characteristic.

10. The method as claimed in claim 6, wherein said determining the overlay contribution of the target asymmetry comprises using said model to solve for said overlay contribution parameter.

11. The method as claimed in claim 6, wherein:
each of said target structures comprise at least two targets, a first target with a first known imposed bias and a second target with a second known imposed bias,
said first asymmetry parameter comprises the difference of asymmetry measurements obtained from said first target and said second target; and
said second asymmetry parameter comprises the sum of asymmetry measurements obtained from said first target and said second target.

12. The method as claimed in claim 1, comprising making direct measurements of the first structure, and using said direct measurements to obtain said structural asymmetry characteristic.

13. The method as claimed in claim 12, wherein:
said first structure is the lowermost structure on the substrate, and
said direct measurement of the first structure prior is made prior to the formation of the second structure.

14. The method as claimed in claim 1, wherein said overlay contribution of the target asymmetry comprises a contribution due to a known imposed bias and a contribution due to an overlay error, and said method comprises determining the contribution due to an overlay error.

15. The method as claimed in claim 1, comprising performing said measuring of each target structure a plurality of times, each time using measurement radiation wherein said at least one selected characteristic is varied.

16. The method as claimed in claim 1, wherein said at least one selected characteristic comprises wavelength and/or polarization.

17. The method as claimed in claim 1, wherein said obtaining a structural asymmetry characteristic comprises obtaining a linear combination of a plurality of structural asymmetry characteristics, each structural asymmetry characteristic being the result of a different processing step.

18. A metrology apparatus comprising:
a support configured to support a substrate having a plurality of target structures thereon;
an optical system configured to perform measuring of each target structure; and
a processor arranged to determine overlay contribution of the target asymmetry of each target structure by being configured to:
measure each target structure with measurement radiation to obtain a measurement of target asymmetry in the target structure, said target asymmetry comprising an overlay contribution due to misalignment of the first and second structures and a structural contribution due to structural asymmetry in at least said first structure;
obtain a structural asymmetry characteristic relating to the structural asymmetry in at least the first structure of each target structure, said structural asymmetry characteristic being independent of at least one selected characteristic of said measurement radiation; and
determining the overlay contribution of the target asymmetry of each target structure from said measurement of target asymmetry and said structural asymmetry characteristic.

19. A lithographic system comprising:
a lithographic apparatus comprising:
an illumination optical system arranged to illuminate a pattern;
a projection optical system arranged to project an image of the pattern onto a substrate; and a metrology apparatus comprising,
   a support configured to support a substrate having a plurality of target structures thereon,
   an optical system configured to perform measuring of each target structure, and
a processor arranged to determine overlay contribution of the target asymmetry of each target structure by being configured to:
   measure each target structure with measurement radiation to obtain a measurement of target asymmetry in the target structure, said target asymmetry comprising an overlay contribution due to misalignment of the first and second structures and a structural contribution due to structural asymmetry in at least said first structure;
   obtain a structural asymmetry characteristic relating to the structural asymmetry in at least the first structure of each target structure, said structural asymmetry characteristic being independent of at least one selected characteristic of said measurement radiation; and
   determine the overlay contribution of the target asymmetry of each target structure from said measurement of target asymmetry and said structural asymmetry characteristic;

wherein the lithographic apparatus is arranged to use the determined overlay contribution calculated by the metrology apparatus in applying the pattern to further substrates.

20. A non-transitory computer-readable medium having instructions stored thereon that, when executed by at least one computing device, causes the at least one computing device to perform operations comprising:
   providing a plurality of target structures on a substrate, each target structure comprising a first structure and a second structure on different layers of the substrate;
   measuring each target structure with measurement radiation to obtain a measurement of target asymmetry in the target structure, said target asymmetry comprising an overlay contribution due to misalignment of the first and second structures and a structural contribution due to structural asymmetry in at least said first structure;
   obtaining a structural asymmetry characteristic relating to the structural asymmetry in at least the first structure of each target structure, said structural asymmetry characteristic being independent of at least one selected characteristic of said measurement radiation; and
   determining the overlay contribution of the target asymmetry of each target structure from said measurement of target asymmetry and said structural asymmetry characteristic.

* * * * *